United States Patent
Henspeter (10) Patent No.: US 10,928,438 B2
(45) Date of Patent: Feb. 23, 2021

(54) EMBEDDED PHOTODETECTOR AS DEVICE HEALTH MONITOR FOR HOT CARRIER INJECTION (HCI) IN POWER SEMICONDUCTORS

(71) Applicant: International Business Machines Corporation, Armonk, NY (US)

(72) Inventor: Justin E. Henspeter, Kasson, MN (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 15/655,661

(22) Filed: Jul. 20, 2017

(65) Prior Publication Data
US 2019/0025366 A1    Jan. 24, 2019

(51) Int. Cl.
*G01R 31/26* (2020.01)
*H01L 31/113* (2006.01)
*H01L 31/0328* (2006.01)
*G01R 31/28* (2006.01)
*H01L 27/144* (2006.01)

(52) U.S. Cl.
CPC ..... *G01R 31/2621* (2013.01); *G01R 31/2642* (2013.01); *G01R 31/2644* (2013.01); *G01R 31/2858* (2013.01); *H01L 27/1443* (2013.01); *H01L 31/0328* (2013.01); *H01L 31/1136* (2013.01)

(58) Field of Classification Search
CPC .............. G01R 31/2621; G01R 31/2642
USPC .................................................. 324/762.09
See application file for complete search history.

(56) References Cited

U.S. PATENT DOCUMENTS

| | | | |
|---|---|---|---|
| 5,648,979 A | 7/1997 | Mun et al. | |
| 5,994,720 A | 11/1999 | Snyman et al. | |
| 5,999,011 A | 12/1999 | Chu et al. | |
| 6,028,952 A | 2/2000 | Kash et al. | |
| 6,111,271 A | 8/2000 | Snyman et al. | |
| 6,496,022 B1 | 12/2002 | Kash et al. | |
| 6,781,169 B2 * | 8/2004 | Roy | H01L 27/1443 257/292 |
| 6,963,215 B1 | 11/2005 | Mastrapasqua | |
| 7,039,566 B2 | 5/2006 | Koike | |

(Continued)

FOREIGN PATENT DOCUMENTS

CN   204301972 U   4/2015

*Primary Examiner* — Reena Aurora
(74) *Attorney, Agent, or Firm* — Kelsey M. Skodje (57) ABSTRACT

A semiconductor device with at least one embedded photodetector is disclosed. The at least one photodetector is embedded in a hot carrier injection (HCI) area, and detects a quantity of emitted photons. Further, the photodetector triggers a warning when the photodetector detects a number of photons greater than a threshold number of photons. Additional embodiments are directed to a method of detecting HCI. The method includes embedding a photodetector in a power semiconductor device, setting at least one threshold number of photons, detecting photons, determining a number of photons, determining when the number of photons is above a threshold number of photons, and generating a warning. When the number of photons is above the threshold, the warning is triggered. Further embodiments are directed to an article of manufacture comprising at least one semiconductor device with at least one photodetector embedded in an area predicted to experience HCI.

20 Claims, 4 Drawing Sheets

(56) References Cited

U.S. PATENT DOCUMENTS

| | | |
|---|---|---|
| 7,400,154 B2 | 7/2008 | Desplats et al. |
| 7,439,730 B2 | 10/2008 | Desplats et al. |
| 7,982,226 B2 | 7/2011 | Lee et al. |
| 8,063,424 B2 | 11/2011 | Gebara et al. |
| 10,002,810 B2 * | 6/2018 | Jenkins .................. H01L 22/34 |
| 10,451,669 B2 * | 10/2019 | Marques Martins ....................... G01R 31/2621 |
| 2007/0235877 A1 | 10/2007 | Reshotko et al. |
| 2012/0286355 A1 * | 11/2012 | Mauder ............. H01L 21/02145 257/330 |
| 2017/0229536 A1 * | 8/2017 | Stuber ................ H01L 29/0626 |

* cited by examiner

EMBEDDED PHOTODETECTOR AS DEVICE HEALTH MONITOR FOR HOT CARRIER INJECTION (HCI) IN POWER SEMICONDUCTORS

BACKGROUND

The present disclosure relates to photodetectors in semiconductor devices and, more specifically, to embedded silicon photodetectors for monitoring the health of power semiconductors.

Power semiconducting devices are semiconductors used in the control and conversion of electrical power. An example of a power semiconducting device is a power metal-oxide-semiconductor field-effect transistor (MOSFET). Power MOSFETs employ an electrical field to alter or control the flow of charge carriers through a conducting channel. Hot carrier injection (HCI) is a phenomenon that can occur in power MOSFETs in which a charge carrier gains sufficient kinetic energy to escape the conducting channel and enter the gate dielectric, usually $SiO_2$. When HCI occurs, photons can be emitted in the visible and near infrared (IR) ranges.

SUMMARY

Figure 1:
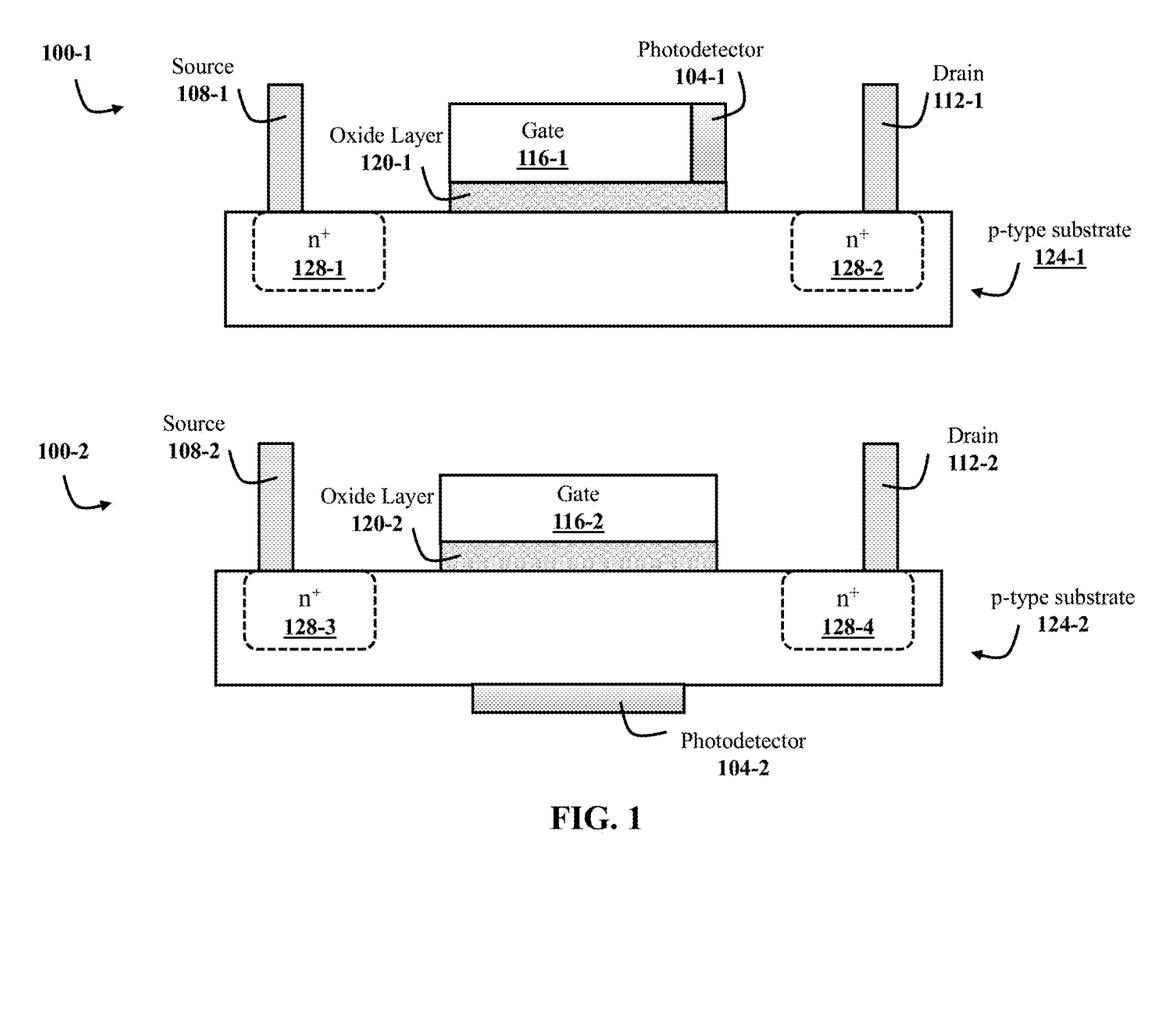
FIG. 1 is a schematic diagram illustrating two examples of power MOSFETs with embedded photodetectors, according to some embodiments of the present disclosure.

FIG. 1 is a schematic diagram illustrating two examples of power MOSFETs with embedded photodetectors, according to some embodiments of the present disclosure. Various embodiments are directed to a semiconductor device comprising a source, drain, gate, oxide layer, n-type substrate, p-type substrate, hot carrier injection (HCI) area, and photodetector embedded in the HCI area. The semiconductor device can be a power semiconductor device, such as a power metal-oxide-semiconductor field-effect transistor (MOSFET). The photodetector can measure photon emission due to HCI by measuring the number of emitted photons, detecting a color change caused by photon emission, detecting an electrical signal caused by photon emission, etc. The photodetector can also trigger a warning when the photodetector detects a number of photons greater than a threshold number of photons.

Additional embodiments are directed to a method of detecting hot carrier injection (HCI). The method can include embedding a photodetector in a power semiconductor device, such as a MOSFET, detecting photons released by the power semiconductor device, and determining when the number of photons released is above a threshold number of photons. When the number of photons is above the threshold, a warning can be triggered. The number of photons can be determined directly or from an electrical current or color change caused by released photons.

Further embodiments are directed to an article of manufacture (e.g., power supplies, DC-to-DC converters, low voltage motor controllers, integrated circuits, etc.) comprising at least one semiconductor device with a photodetector embedded in an area predicted to experience HCI. The photodetector can be embedded in the semiconductor device or near at least one semiconductor device. In some embodiments, the semiconductor device is a power semiconductor device, such as a power MOSFET. Additional examples of semiconductor devices can include insulated-gate bipolar transistor, junction gate field-effect transistors (FETs), metal-semiconductor FETs, metal-insulator-semiconductor FETs, metal-nitride-oxide-semiconductor transistors, dual-gate metal-oxide-semiconductor FETs, fast-reverse epitaxial diode FETs, heterostructure insulated gate FETs, modulation-doped FETs, tunnel FETs, high-electron-mobility FETs, ion-sensitive FETs, biologically-sensitive FETs, nanoparticle organic memory FETs, graphene nanoribbon FETs, vertical-slit FETs, carbon nanotube FETs, organic FETs, deoxyribonucleic acid FETs, quantum FETs, etc.

DETAILED DESCRIPTION

Power semiconductor devices are used in the control and conversion of electrical power. For example, power semiconductor devices can be used as switches or amplifiers. Examples of power semiconductor devices can include power diodes, thyristors, field-effect transistors (FETs), etc. One example of an FET that is used as a power semiconductor device is a power metal-oxide-semiconductor field-effect transistors (power MOSFETs). MOSFETs are frequently used as power devices because of their low gate drive power, fast switching speed, and good paralleling capabilities. Power MOSFETs can be found in power supplies, DC-to-DC converters, low voltage motor controllers, etc. MOSFETs are not exclusively used as power devices, and can also be found in applications such as integrated circuits. The structure and operation of MOSFETs are discussed in greater detail below with respect to FIG. 1.

Power semiconductors use fluctuations in an electrical field to control the flow of charge carriers through a conducting channel. Charge carriers can be either negatively charged electrons or positively charged holes. In some cases, charge carriers can gain enough kinetic energy to break a potential energy barrier, and escape the conducting channel. This phenomenon is called hot carrier injection (HCI), and is often accompanied by the release of electromagnetic radiation (i.e., photons) in the visible and near infrared (IR) range. HCI can reduce the efficiency of the device by allowing charge carriers to escape the semiconductor layer. HCI can result in gate oxide damage, which can adversely affect the reliability of the device. When a power semiconductor device fails, the failure is frequently, at least in part, caused by HCI. Therefore, monitoring a power semiconductor device for signs of HCI can allow a user to take action before the device becomes unreliable or suffers catastrophic failure. For example, the user can remove and/or replace the semiconductor device.

According to some embodiments of the present disclosure, photons are detected by one or more photodetectors embedded in a power semiconductor device, such as a power MOSFET. The photodetectors are used to monitor the health of the device, and to trigger a warning if the device is approaching failure. The level of HCI, as indicated by the quantity of released photons, is used as a measure of the health of the device. The warning alerts a user that HCI is at a level that may cause damage to the device. When the warning is generated, the user can take actions that will prevent further damage or device failure, such as replacing, isolating, repairing, or turning off devices that are near failure. In some embodiments, these actions can be automated.

While examples involving power MOSFETs are discussed herein, the embedded photodetectors can monitor the health of any solid-state electronic device that can be affected by HCI. The solid-state electronic devices can be used in power electronics or in other applications, such as integrated circuits. Examples of solid-state electronic devices that can be monitored by the photodetectors can include diodes, thyristors, and field-effect transistors (FETs). Examples of FETs can include insulated-gate bipolar transistors (IGBTs), junction gate FETs (JFETs), metal-semiconductor FETs (MESFETs), metal-insulator-semiconductor FETs (MISFETs), metal-oxide-semiconductor FETs (MOSFETs), metal-nitride-oxide-semiconductor (MNOS) transistors, dual-gate MOSFETs, fast-reverse epitaxial diode FETs (FREDFETs), heterostructure insulated gate FETs (HIGFETs), modulation-doped FETs (MODFETs), tunnel FETs (TFETs), high-electron-mobility FETs (HEMFETs), ion-sensitive FETs (ISFETs), biologically-sensitive FETs (BioFETs), nanoparticle organic memory FETs (NOMFETs), graphene nanoribbon FETs (GNRFETs), vertical-slit FETs (VeFETs), carbon nanotube FETs (CNFETs), organic FETs (OFETs), quantum FETs (QFETs), etc.

FIG. 1 is a schematic diagram illustrating two examples of power MOSFETs 100-1 and 100-2 (referred to collectively as 100) with embedded photodetectors 104-1 and 104-2 (referred to collectively as 104), according to some embodiments of the present disclosure. Power MOSFETs 100 control and convert electrical power by modulating charges. Electrons are able to flow from a source 108-1 or 108-2 (referred to collectively as 108) to a drain 112-1 or 112-2 (referred to collectively as 112) when a charge is applied to a gate terminal 116-1 or 116-2 (referred to collectively as 116). The gate terminal 116 can be an aluminum gate, or it can be made from materials such as polysilicon, tungsten, a silicide (e.g., TiSi, MoSi, TaSi, WSi, etc.), ruthenium(IV) oxide, tantalum, niobium, tantalum nitride, etc.

A dielectric oxide layer 120-1 or 120-2 (referred to collectively as 120) insulates the gate terminal 116 from a p-type semiconductor substrate 124-1 or 124-2 (referred to collectively as 124). Examples of dielectric oxide materials can include silicon dioxide and silicon oxynitride. Examples of semiconductor substrate materials can include silicon, silicon-germanium, germanium, graphene, amorphous silicon, polycrystalline silicon, organic semiconductors, silicon carbide (SiC), gallium arsenide (GaAs), gallium nitride (GaN), indium gallium arsenide (InGaAs), etc.

The power MOSFETs 100 illustrated herein are simple examples of planar p-type MOSFETs. In p-type MOSFETs 100, the source 108 and drain 112 are connected to n-doped regions 128-1/128-2 or 128-3/128-4 (referred to collectively as 128) in the p-type substrate 124. However, n-type MOSFETs, which have n-type substrates with p-doped regions connected to the source and drain, can also be used. Examples of n-dopants can include phosphorus, arsenic, antimony, bismuth, lithium, etc., and examples of p-dopants can include boron, aluminum, nitrogen, gallium, indium, etc. Additionally, in some embodiments, the MOSFETs 100 are vertical rather than planar.

The photodetector 104 embedded in the MOSFET 100 is placed in a location that is likely to experience HCI, and monitors the extent of hot carrier injection (HCI). For example, the photodetector 104-1 can be placed between the gate 116-1 and the drain 112-1. The photodetector 104-2 can also be placed on the substrate 124-2. Areas that experience hot carrier injection are referred to herein as hot carrier injection (HCI) areas. Further, the location of the photodetector 104 can vary depending on the type or structure of the device 100. The placement of the photodetector 104 is discussed in greater detail with respect to FIG. 2.

In some embodiments, the photodetector 104 is a semiconductor silicon photodetector, though other types of photodetector can be used. Examples of these photodetectors can include other types of semiconductor photodetectors, such as cadmium zinc telluride (CdZnTe) radiation detectors, charge-coupled devices (CCDs), mercury cadmium telluride (HgCdTe) radiation detectors, light-emitting diodes (LEDs) acting as photodiode light sensors, photoresistors, photodiodes, phototransistors, quantum dot photoconductors, graphene/silicon photodetectors, etc.

Additionally, the photodetector 104 can be a photocathode or a photochemical detector. Photocathodes act as photodetectors 104 by converting photons to electricity. A photocathode has a negatively charged electrode in a light detection device (e.g., a photomultiplier or phototube), that is coated with a photosensitive material. Examples of photocathode materials can include silver-oxygen-cesium (Ag—O—Cs), antimony-cesium (Sb—Cs), antimony-rubidium-cesium (Sb—Rb—Cs), antimony-potassium-cesium (Sb—K—Cs), sodium-potassium-antimony-cesium (Na—K—Sb—Cs), gallium(III) arsenide (GaAs), InGaAs (indium gallium arsenide), cesium telluride ($Cs_2Te$), cesium iodide (CsI), etc. Photochemical detectors act as photodetectors 104 by producing a color change caused by a photochemical reaction between photons released during HCI and a material in the detector. For example, a photosensitive film can contain a dye or a silver salt that changes color when exposed to light. Additionally, paper or glass plates can be coated in photosensitive compounds such as silver salts (e.g., silver bromide (AgBr), silver chloride (AgCl), or an AgBr/AgCl mixture), platinum or palladium compounds, dyes, etc. Photochemical detectors are discussed in greater detail with respect to FIG. 4.

Figure 2:
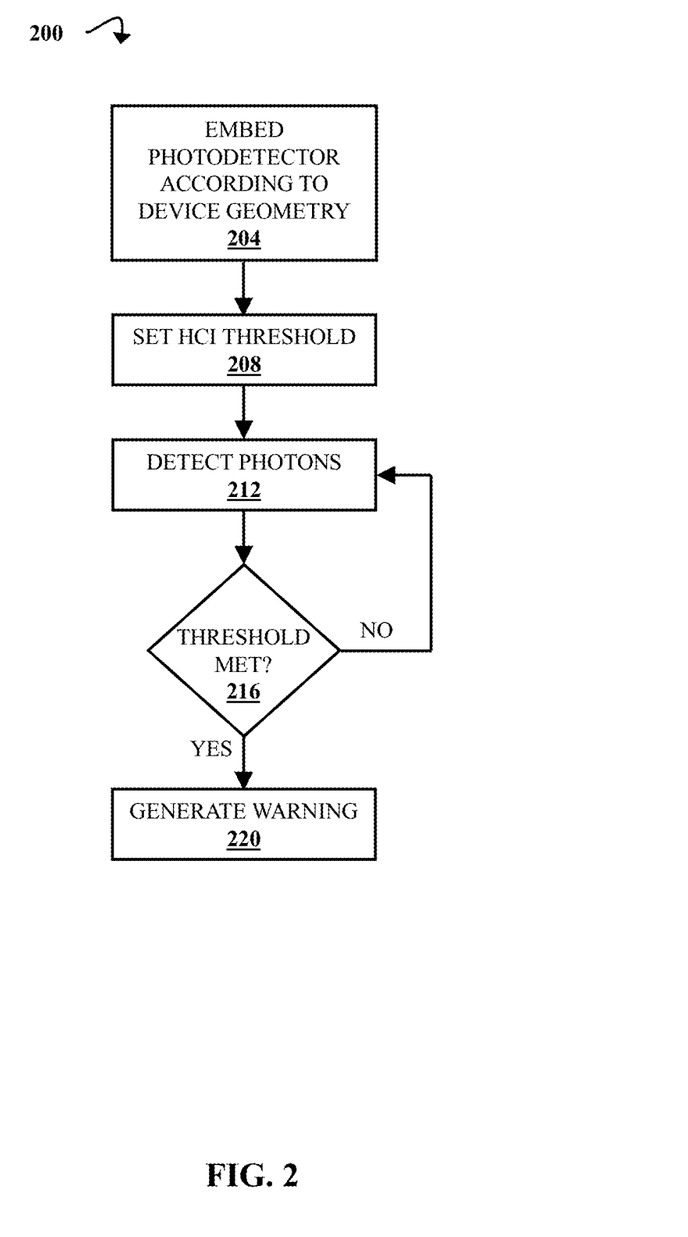
FIG. 2 is a flow diagram illustrating a process of monitoring the health of a power semiconductor device, according to some embodiments of the present disclosure.

FIG. 2 is a flow diagram illustrating a process 200 of monitoring the health of a power semiconducting device, according to some embodiments of the present disclosure. The process begins when a photodetector 104 is embedded within the device according the geometry of the particular device. This is illustrated at step 204. The photodetector 104 can be placed in an HCI area (i.e., an area where hot carrier injection (HCI) is most likely to occur). For example, in a power MOSFET 100, the area between the gate 116 and the drain 112 or the area at the substrate 124 can be HCI areas. Additionally, the structure of the device can influence the placement of the photodetector 104. For example, a photodetector 104 may be placed differently in a planar MOSFET than in a vertical MOSFET as the gate 116 and drain 112 are in different locations.

In some embodiments, a MOSFET 100 can have more than one photodetector 104. A photodetector 104 can also be embedded in a device that contains at least one MOSFET 100 without being embedded in the MOSFET 100 itself. For example, in a device that includes parallel MOSFETs, an HCI area may be an area near the MOSFETs. A photodetector 104 can be positioned in this HCI area so that it detects photons from one or more MOSFETs. Additionally, more than one photodetector 104 can be positioned to detect photons from one or more MOSFETs.

The quantity of photons determined by the photodetector 104 corresponds to the level of HCI occurring within the device. A threshold number of photons that corresponds to a level of HCI that is sufficient or nearly sufficient for device failure is set. This is illustrated at step 208. The threshold number depends on the device being used, and is set during the design or manufacture of the device. For example, devices made from materials that are more sensitive to HCI or devices that operate under conditions that can promote HCI (e.g., raised voltage, elevated temperature, extended period of operation, etc.) may have lower threshold numbers than more robust or protected devices. The number of photons can be determined in a variety of ways, as is discussed in greater detail below. Further, more than one threshold can be selected. This is discussed in greater detail with respect to FIG. 3.

The photodetector 104 embedded in the MOSFET 100 detects photons in order to determine if the threshold has been reached. This is illustrated at step 212. In some embodiments, such as when the photodetector is a semiconductor, the photodetector 104 can determine the quantity of photons by counting the number of photons. In other embodiments, such as when the photodetector 104 is a photocathode, the quantity of photons can be monitored as an electrical current generated by the photons. Additionally, when the photodetector 104 is a photochemical detector, the quantity of photons can be indicated by a color change. This is discussed in greater detail with respect to FIG. 4.

As the photodetector 104 monitors the quantity of photons, it determines when the threshold number of photons has been met. This is illustrated at step 216. If the threshold is not met, the photodetector 104 continues to monitor the photons, as is illustrated at step 212. However, if a threshold number of photons is met, a warning is generated. This is illustrated at step 220. The generation of the warning can be triggered in different ways. For example, a semiconductor photodetector can digitally record the number of photons detected, and flag a warning bit from the MOSFET 100 when the number of photons reaches the threshold number. The warning can also be triggered when an electrical current generated by a photocathode photodetector reaches a threshold current. Further, In the case of photochemical detectors, such as photosensitive film, the warning can be triggered when a threshold area or concentration of color change develops. Additionally, the electrical current and/or color change can be used to calculate the number of released photons in order to determine if the threshold number of photons has been reached.

The generated warning can take a variety of forms. In some embodiments, the generated warning is a message displayed on an electronic device, such as a computer monitor, a mobile device screen, or any digital display. The warning can be displayed on the device as text, icons, images, colors, etc. However, other warnings can also be used. For example, in some embodiments the warning is a sound, such as a beep, ding, buzz, recorded voice, computer-generated voice, etc. Further, the warning can be sent to the user as a text message, email, phone call, pop-up message, etc. Additionally, data regarding the quantity of photons (e.g., photon count, electrical signal, color change, etc.) can be displayed.

In some embodiments, no warning is sent to the user when a threshold is met. Instead, data regarding the quantity of photons released by the power device is collected and stored in a computer memory. The user can then view this data at a later time. In other embodiments, the user can periodically look at a photosensitive film in order to determine whether there is a color change. Additionally, photon quantity data can be collected, stored, and reported on a digital display in a form such as a graph, table, image, textual description, etc.

Figure 3:
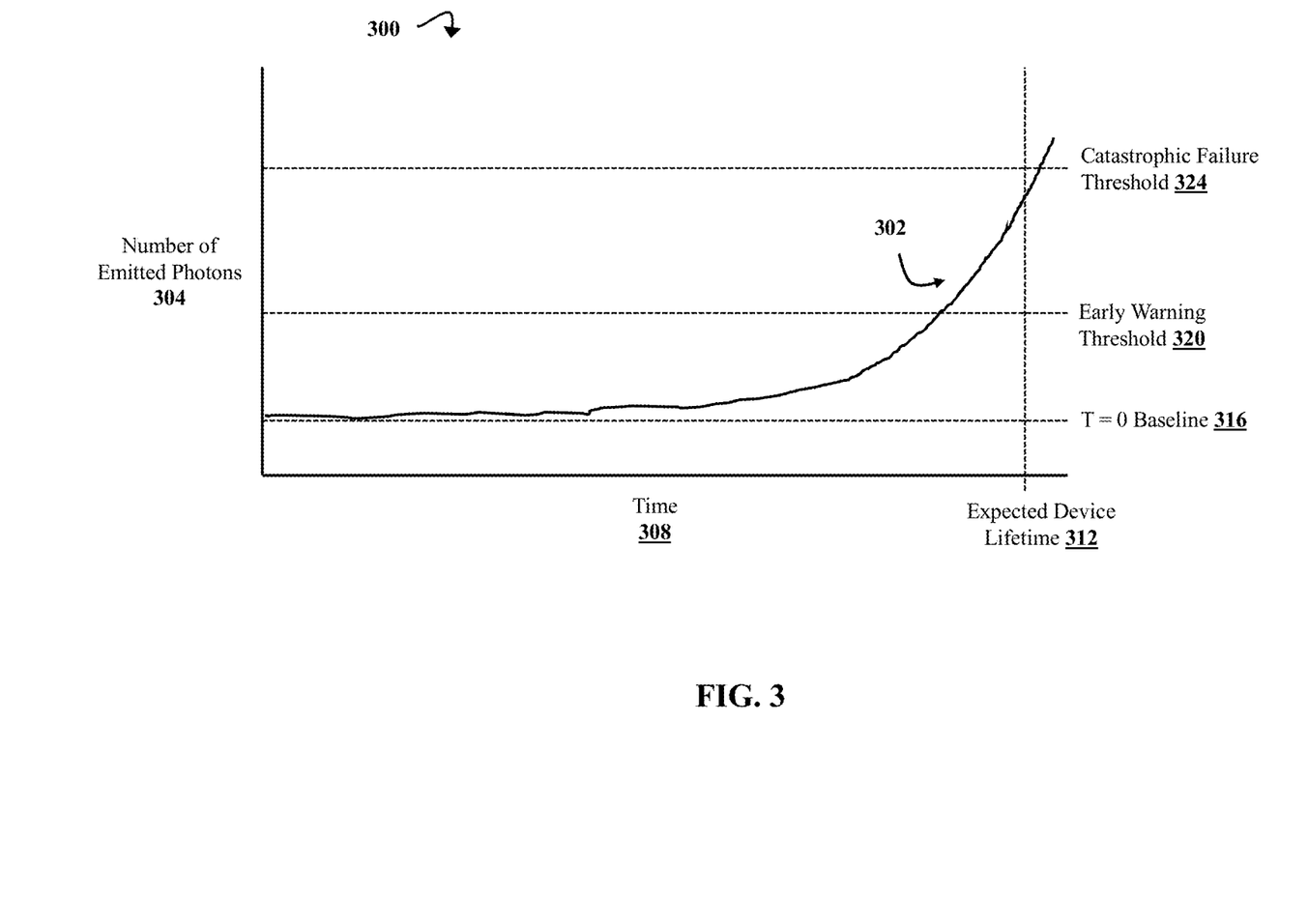
FIG. 3 is a chart illustrating an example of plotted device health data collected by a photodetector, according to some embodiments of the present disclosure.

FIG. 3 is a chart 300 illustrating an example of plotted device health data 302 collected by a photodetector 104, according to some embodiments of the present disclosure. The device health data 302 in this chart 300 is the number of photons emitted 304 by a MOSFET 100 over a period of time 308. Though the y-axis of the chart 300 shows a measure of the number of photons 304, other indicators of photon emission can be monitored, such as an electrical current or color change. The x-axis, time 308, can be measured in any units and on any scale (e.g., minutes, days, years, etc.). The time scale can vary depending on the identity of the power semiconductor device in which the photodetector is embedded. For example, some MOSFETs 100 may be expected to function for one year, and others for a decade. This time scale is indicated by a defined "expected device lifetime" 312.

A baseline 316 number of photons (i.e., a number of photons 304 detected or expected to be detected when the MOSFET 100 begins operating at time (T)=0) is determined when the MOSFET 100 is designed or manufactured. As the MOSFET 100 operates, a number of photons 304 detected above the baseline 316 indicates that hot carrier injection (HCI) has occurred. When the number of photons 304 reaches an early warning threshold 320 number, an early warning is triggered. The early warning indicates that the MOSFET 100 is near failure, and may need to be removed or replaced. A catastrophic failure threshold 324 number is also defined. The catastrophic failure threshold 324 is a number of photons 304 indicating that sufficient HCI has occurred to result in total failure of the MOSFET 100. While one early warning threshold 320 and one catastrophic warning threshold 324 are illustrated in this example, more than one early warning 320 threshold can be defined. Additionally, in some embodiments, no catastrophic failure threshold 324 is defined.

Figure 4:
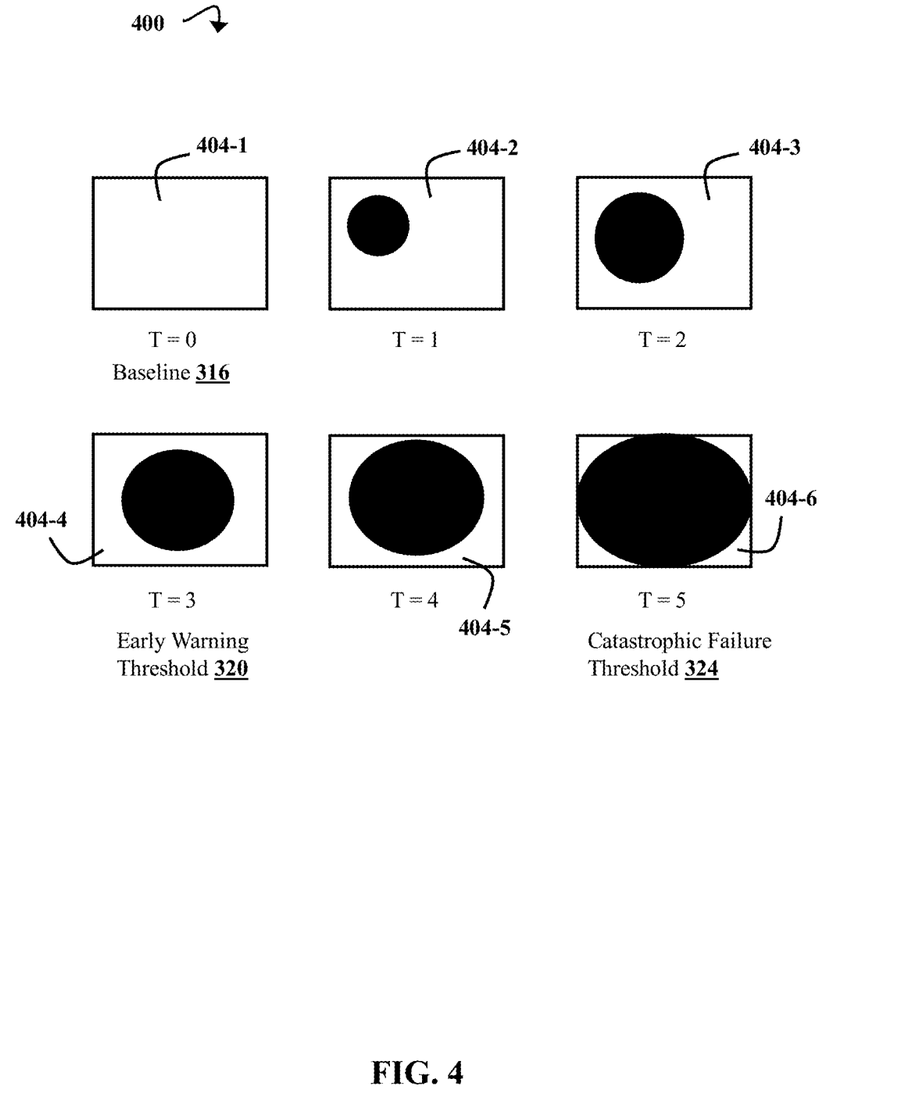
FIG. 4 is a schematic diagram illustrating an example of a photosensitive film as it detects photons over a period of time, according to some embodiments of the present disclosure.

FIG. 4 is a schematic diagram 400 of a photosensitive film 404 as it detects photons over a period of time, according to some embodiments of the present disclosure. The photosensitive film 404 is a type of photochemical detector. Each box 404-1, 404-2, 404-3, 404-4, 404-5, and 404-6 represents an image of the photosensitive film 404 at different times (T=0, 1, 2, 3, 4, and 5, respectively). The units of time in this illustration are arbitrary. Color changes in the photosensitive film 404 caused by a reaction with photons released during hot carrier injection (HCI) indicate possible damage (e.g., loss of efficiency or reliability) to the MOSFET 100 by HCI. In the diagram 400, color changes are indicated by a black oval on a white photosensitive film 404. However, the original color and the changed color depend on the identity of the material in the film, and can be any color. Further, the area of color change can appear in any shape. The color change can be viewed by the user through a window or in a photographic image in some embodiments. Additionally, the color change can be detected by a spectrophotometer or a colorimeter. Further, the color change can itself be a warning to the user, though a detected color change can also trigger a computer generated warning.

At T=0, no color change has occurred in the photosensitive film 404-1, and the number of photons is at the baseline 316. At T=1, a partial color change, indicated by the black oval, is visible in the photosensitive film 404-2. This indicates that hot carrier injection (HCI) has begun to occur. At T=2, the area of the color change in the photosensitive film 404-3 has increased, indicating an increase in HCI, but a warning threshold has not yet been reached. Then, at T=3, the area of color change in the photosensitive film 404-4 is large enough to indicate that the early warning threshold 320 number of photons has been reached. At T=4, the area of color change in the photosensitive film 404-5 has increased beyond the early warning threshold 320, but does not yet indicate that the MOSFET 100 is at the point of failure. However, at T=5, the area of color change in the photosensitive film 404-6 is large enough to indicate that the catastrophic failure threshold 324 has been reached, and the MOSFET 100 will no longer operate.

The examples discussed herein and represented in the accompanying drawings may make reference to particular details. However, it will be understood that there are various modifications that can be made while retaining the spirit and scope of the disclosure. These would be easily recognized and carried out by one of ordinary skill in the art.

What is claimed is:

1. A semiconductor device comprising:
    a source;
    a drain;
    a gate;
    an oxide layer;
    a p-type substrate;
    an n-type substrate;
    at least one hot carrier injection area; and
    at least one photodetector, wherein the at least one photodetector is embedded in the at least one hot carrier injection area, and wherein the at least one photodetector determines whether a number of photons is above a threshold number of photons.

2. The semiconductor device of claim 1, wherein the semiconductor device is a power semiconductor device.

3. The semiconductor device of claim 1, wherein the semiconductor device is a metal-oxide-semiconductor field-effect transistor.

4. The semiconductor device of claim 1, wherein the at least one photodetector is selected from a group consisting of a silicon photodetector, a cadmium zinc telluride radiation detector, a mercury cadmium telluride radiation detector, a light-emitting diode, a photoresistor, a photodiode, a phototransistor, a quantum dot photoconductor, a graphene/silicon photodetector, a photocathode, and a photochemical detector.

5. The semiconductor device of claim 1, wherein the at least one photodetector triggers a warning when the at least one photodetector detects a number of photons above a threshold number of photons.

6. The semiconductor device of claim 1, wherein the at least one photodetector triggers a warning when the at least one photodetector detects a color change above a threshold color change.

7. The semiconductor device of claim 1, wherein the at least one photodetector triggers a warning when the at least one photodetector detects an electrical current above a threshold electrical current.

8. A method of detecting hot carrier injection in a semiconductor device having a hot carrier injection area, comprising:
    embedding at least one photodetector in the hot carrier injection area;
    setting at least one threshold number of photons;
    detecting photons;
    determining a number of the photons; and
    determining when the number of the photons meets the at least one threshold number of photons.

9. The method of claim 8, wherein the semiconductor device is a power semiconductor device.

10. The method of claim 8, wherein the semiconductor device is a metal-oxide semiconductor field-effect transistor.

11. The method of claim 8, wherein the at least one photodetector is selected from a group consisting of a silicon photodetector, a cadmium zinc telluride radiation detector, a mercury cadmium telluride radiation detector, a light-emitting diode, a photoresistor, a photodiode, a phototransistor, a quantum dot photoconductor, a graphene/silicon photodetector, a photocathode, a photosensitive film, and a photosensitive plate.

12. The method of claim 8, wherein the number of the photons is determined from an electrical signal generated by the photons.

13. The method of claim 8, wherein the number of the photons is determined from a color change caused by a photochemical reaction.

14. The method of claim 8, further comprising generating at least one warning in response to the determining when the number of the photons meets the at least one threshold number of photons.

15. An article of manufacture having at least one hot carrier injection area, comprising:
    at least one semiconductor device; and
    at least one photodetector, wherein the at least one photodetector is embedded in the at least one hot carrier injection area, and wherein the at least one photodetector determines whether a number photons is above a threshold number of photons.

16. The article of manufacture of claim 15, wherein the at least one hot carrier injection area is in the semiconductor device.

17. The article of manufacture of claim 15, wherein the at least one hot carrier injection area is near two or more semiconductor devices from the at least one semiconductor device.

18. The article of manufacture of claim 15, wherein the at least one semiconductor device is a power semiconductor device.

19. The article of manufacture of claim 15, wherein the at least one semiconductor device is selected from a group consisting of an insulated-gate bipolar transistor, a junction gate field-effect transistor, a metal-semiconductor field-effect transistor, a metal-insulator-semiconductor field-effect transistor, a metal-oxide-semiconductor field-effect transistor, a metal-nitride-oxide-semiconductor transistor, a dual-gate metal-oxide-semiconductor field-effect transistor, a fast-reverse epitaxial diode field-effect transistor, a heterostructure insulated gate field-effect transistor, a modulation-doped field-effect transistor, a tunnel field-effect transistor, a high-electron-mobility field-effect transistor, an ion-sensitive field-effect transistor, a biologically-sensitive field-effect transistor, a nanoparticle organic memory field-effect transistor, a graphene nanoribbon field-effect transistor, a vertical-slit field-effect transistor, a carbon nanotube field-effect transistor, an organic field-effect transistor, a deoxyribonucleic acid field-effect transistor, and a quantum field-effect transistor.

20. The article of manufacture of claim 15, wherein the at least one photodetector is selected from a group consisting of a silicon photodetector, a cadmium zinc telluride radiation detector, a mercury cadmium telluride radiation detector, a light-emitting diode, a photoresistor, a photodiode, a phototransistor, a quantum dot photoconductor, a graphene/silicon photodetector, a photocathode, a photosensitive film, and a photosensitive plate.

* * * * *